(12) United States Patent
Lou

(10) Patent No.: US 6,187,661 B1
(45) Date of Patent: Feb. 13, 2001

(54) METHOD FOR FABRICATING METAL INTERCONNECT STRUCTURE

(75) Inventor: Chine-Gie Lou, Hsinchu Hsien (TW)

(73) Assignee: Worldwide Semiconductor Manufacturing Corp., Hsinchu (TW)

(*) Notice: Under 35 U.S.C. 154(b), the term of this patent shall be extended for 0 days.

(21) Appl. No.: 09/280,628

(22) Filed: Mar. 29, 1999

(30) Foreign Application Priority Data

Mar. 3, 1999 (TW) ................................................ 88103216

(51) Int. Cl.[7] .............................................. H01L 21/4763
(52) U.S. Cl. ........................ 438/622; 438/623; 438/627; 438/637; 438/638; 438/692
(58) Field of Search ..................... 438/622, 627, 438/629, 633, 648, 656, 643, 645, 619, 638, 672, 692, 959, 623, 637; 257/758, 751, 752, 759, 762, 774

(56) References Cited

U.S. PATENT DOCUMENTS

| | | | |
|---|---|---|---|
| 5,578,523 | * 11/1996 | Fiordalice et al. | 438/633 |
| 5,759,906 | * 6/1998 | Lou | 438/623 |
| 5,913,140 | * 6/1999 | Roche et al. | 438/624 |
| 5,916,823 | * 6/1999 | Lou et al. | 438/738 |
| 6,037,664 | * 3/2000 | Zhao et al. | 257/758 |
| 6,114,233 | * 9/2000 | Yeh | 438/622 |

\* cited by examiner

*Primary Examiner*—Matthew Smith
*Assistant Examiner*—Igwe U. Anya
(74) *Attorney, Agent, or Firm*—Jiawei Huang; J. C. Patents

(57) ABSTRACT

A method for fabricating a metal interconnect structure. A first insulating layer and a second insulating layer with a low dielectric constant are formed on a substrate in sequence. An opening is formed in the second insulating layer. A compact and high density third insulating layer is formed on the second insulating layer and in the opening to protect the second insulating layer from being damaged in a subsequent process for removing a photo-resist layer. A contact window is then formed in the third insulating layer at a bottom of the opening and the first insulating layer, so that a dual damascene opening is formed. The dual damascene opening is filled with metal with low resistivity to form the metal interconnect.

15 Claims, 4 Drawing Sheets

METHOD FOR FABRICATING METAL INTERCONNECT STRUCTURE

CROSS-REFERENCE TO RELATED APPLICATION

This application claims the priority benefit of Taiwan application serial no. 88103216, filed Mar. 3, 1999, the full disclosure of which is incorporated herein by reference.

BACKGROUND OF THE INVENTION

1. Field of the Invention

The invention relates in general to a method of fabricating a metal interconnect, and more particularly, to a fabrication method of dual damascene.

2. Description of the Related Art

High-density integrated circuits, such as very large scale integration (VLSI) circuits, are typically formed with two or multiple metal interconnects to serve as three-dimensional wiring line structures to comply with a very high density of devices. A multilevel interconnect structure comprises a first metal wiring layer electrically connecting to a source/drain region in a substrate via a metal plug. The electrical connections between various devices are achieved by the formation of a second or other metal wiring layers. As the integrated density of devices increases, the capacitance effect between metal wires increases. Consequently, the resistance-capacitance time delay (RC delay time) increases, and cross talk between the metal wires become more frequent. The metal wires thus carries a current flow in a slower speed.

In response with the development of the fabrication process of integrated circuits, the resistivity of each of the metal wires and the parasitic capacitance between the metal wires become crucial factors to determine the speed of current flow. To achieve the reduction of the resistivity of metal wires, materials with low resistivity are selected for fabricating the metal wires. The objectivity of reducing the parasitic capacitance can also be achieved by fabricating insulating layers with low dielectric constants between the metal wires.

In a conventional fabrication process, a metal plug is formed in a dielectric layer, followed by forming a metal wiring layer to couple with the metal plug. However, problems of overlay error and process bias frequently occur during photolithography. A dual damascene process has been developed to resolve the problems occurring in the conventional fabrication process, so as to enhance reliability of devices and improve the process performance. The dual damascene thus becomes a popular technique to form a dual damascene structure of insulating layers with low dielectric constants in accordance with highdensity of devices.

FIGS. 1A through 1D are schematic, cross-sectional views showing a conventional method for fabricating a dual damascene structure.

Referring to FIG. 1A, a substrate 100 comprising a transistor is provided. The substrate 100 further comprises a metal wire 102. An oxide layer 104 and a hard mask 106 are formed on the substrate 100 in sequence. A conventional photolithography and etching process is applied to form an opening 108 within the hard mask layer 106.

Referring to FIG. 1B, an oxide layer 110 is deposited on the hard mask layer 106 to fill the opening 108.

Referring to FIG. 1C, a patterned photo-resist layer 112 is formed on the oxide layer 110. Using the hard mask layer 106 as an etching stop layer, the oxide layer 110 is etched with the photo-resist layer 112 as a mask. Meanwhile, the oxide layer 104 at a bottom of the opening 108 is also etched to form a dual damascene opening 114. The photo-resist layer 112 is then stripped using oxygen plasma.

Referring to FIG. 1D, a conductive layer 116 is formed to fill the dual damascene opening 114. A dual damascene structure is thus formed.

As mentioned above, the problem of parasitic capacitance caused by an inter-metal dielectric layer between two metal layers becomes more and more obvious as the integrated density of semiconductor devices grows. Thus, in deep sub-micron semiconductor fabrication process, an inter-metal dielectric layer with a low dielectric constant such as the oxide layer 110 shown in FIG. 1B is used to moderate the effect of RC time delay. However, a photo-resist layer is typically made of high molecular material, and the inter-metal dielectric layer with a low dielectric constant is very often made of material like polymer. The inter-metal dielectric layer with a low dielectric constant is easily damaged by oxygen plasma while stripping the photo-resist layer. The resultant dual damascene 114 (shown in FIG. 1D) is thus poisoned to cause an out-gassing phenomenon when the opening 114 is filled with the conductive layer 116. The out-gassing phenomenon frequently results in a bad contact between the conductive layer 116 and the underlying metal wire 102, even causes an open circuit therebetween.

SUMMARY OF THE INVENTION

The invention provides a method for fabricating a metal interconnect structure. An insulating layer with a low dielectric constant is used to reduce a RC delay time. By the invention, the problems of the insulating layer damaged by the oxygen plasma and the poisoned dual damascene opening can be resolved.

In one embodiment of the invention, a substrate with a first conductive layer is provided. A first insulating layer and a second insulating layer with a low dielectric constant are sequentially formed on the substrate. The second insulating layer is patterned to form a first opening positioned above the first conductive layer to expose a part of the first insulating layer. A third insulating layer is formed in the first opening and on the second insulating layer. The third insulating layer within the first opening and the first insulating layer underlying the first opening are patterned to form a second opening which exposes a part of the first conductive layer. The material of the third insulating layer is compact. The third insulating layer is formed with a high density and sufficiently compact to prevent the second insulating layer from being damaged while removing a photo-resist layer formed for patterning a second opening. The second and the first openings are then filled with a second conductive layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
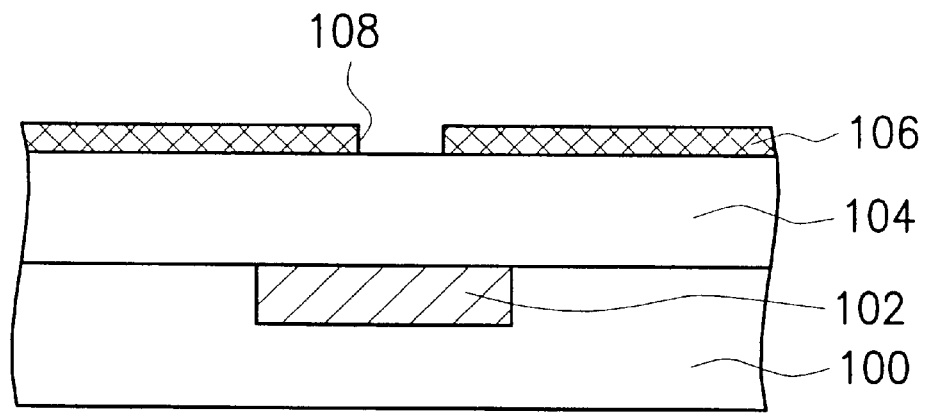
FIGS. 1A through 1D are schematic, cross-sectional views showing a conventional method for fabricating a dual damascene structure.
Figure 1B:
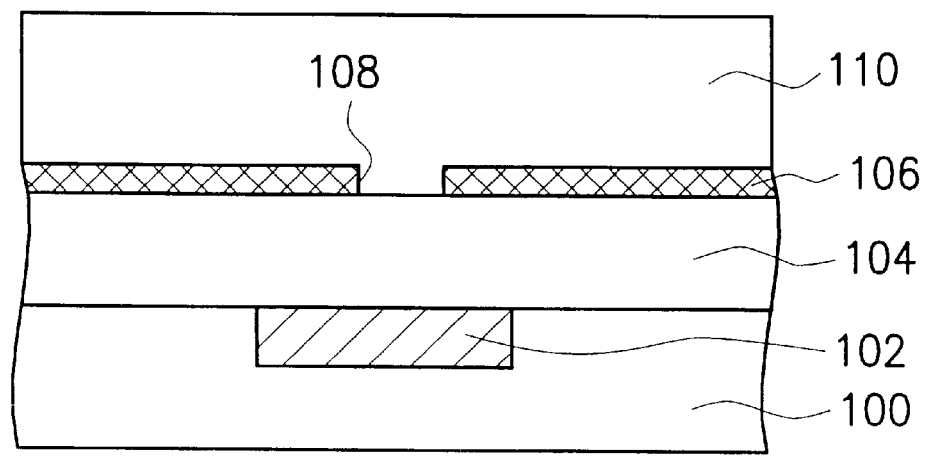
Figure 1C:
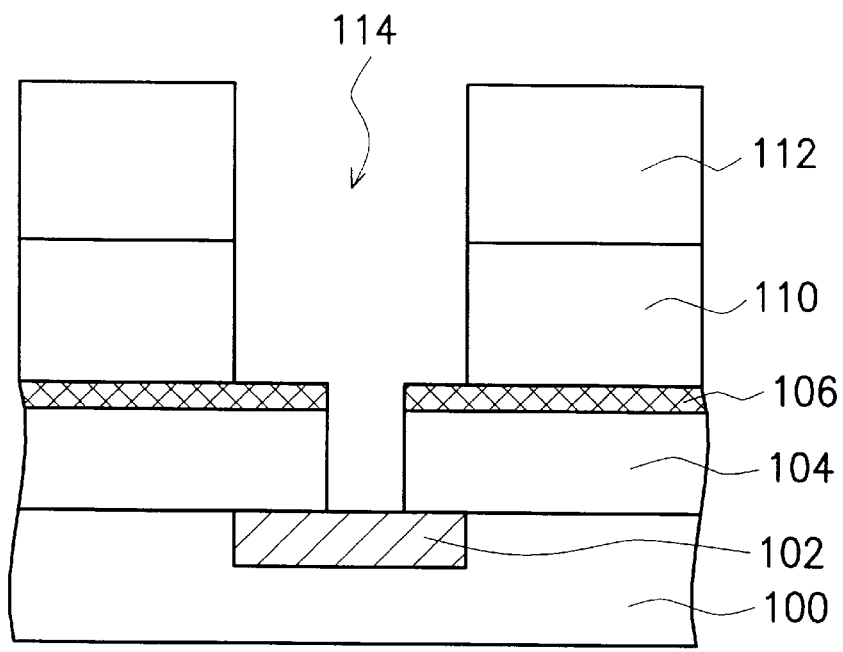
Figure 1D:
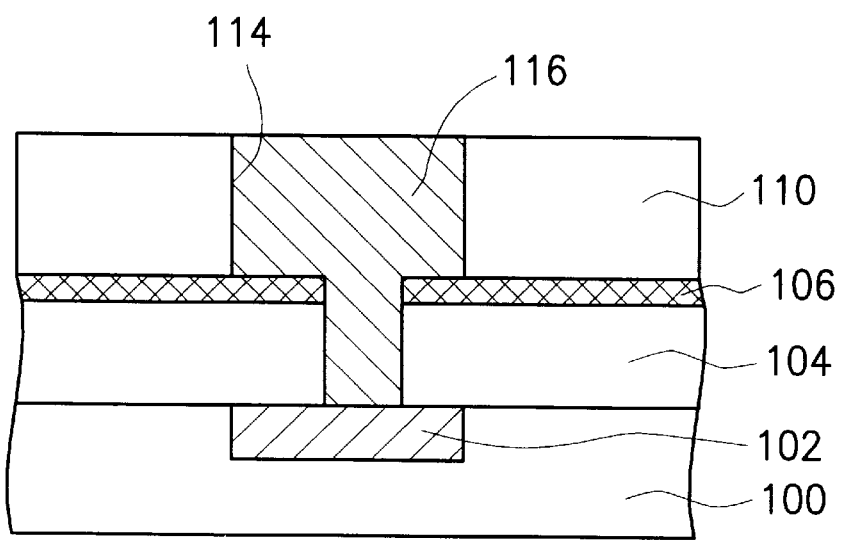
Figure 2A:
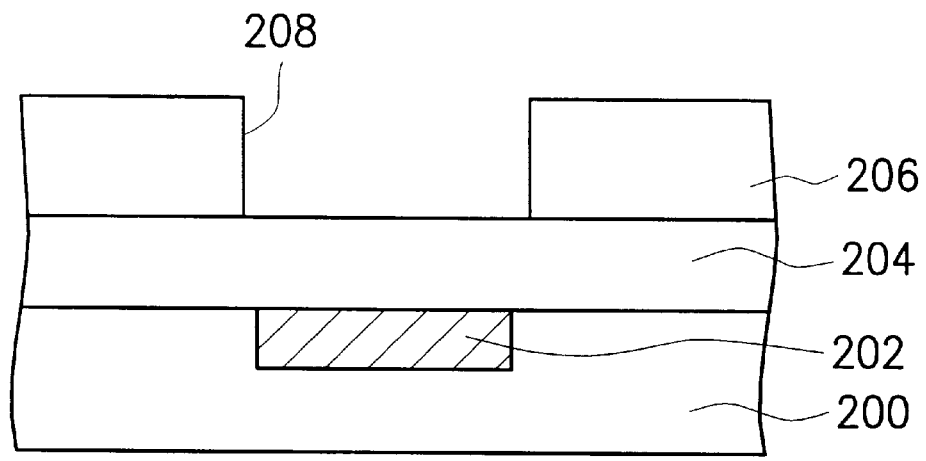
FIGS. 2A through 2D are schematic, cross-sectional views showing the process steps of one preferred embodiment of the method for fabricating a metal interconnect structure.

In FIG. 2A, a substrate 200 is provided. The substrate 200 may comprise some semiconductor structures, such as a metal oxide semiconductor (MOS) transistor. A conductive layer 202, such as a wiring layer couple with the MOS transistor, is formed within the substrate 200. A first insulating layer 204, for example, an oxide layer formed by chemical vapor deposition (CVD), is formed on the substrate 200. A second insulating layer 206 is formed on the first insulating layer 204. The material of the insulating layer 206 is selected from materials with a low dielectric constant, for example, spin-on polymer (SOP) such as Flare, SILK, parylene, and PAE-II. The spin-on polymer comprises Flare, SILK, Parylene or PAE-II. The insulating layer 206 is patterned to form a first opening 208 positioned over the conductive layer 202, so that a part of the insulating layer 204 is exposed by the first opening 208. The patterning step can be performed using a photolithography and etching process, for example. A patterned photo-resist layer is formed on the insulating layer 206. Using the photo-resist layer as a mask, the insulating layer 206 is etched to form an opening 208 to expose a part of the insulating layer 204.

Figure 2B:
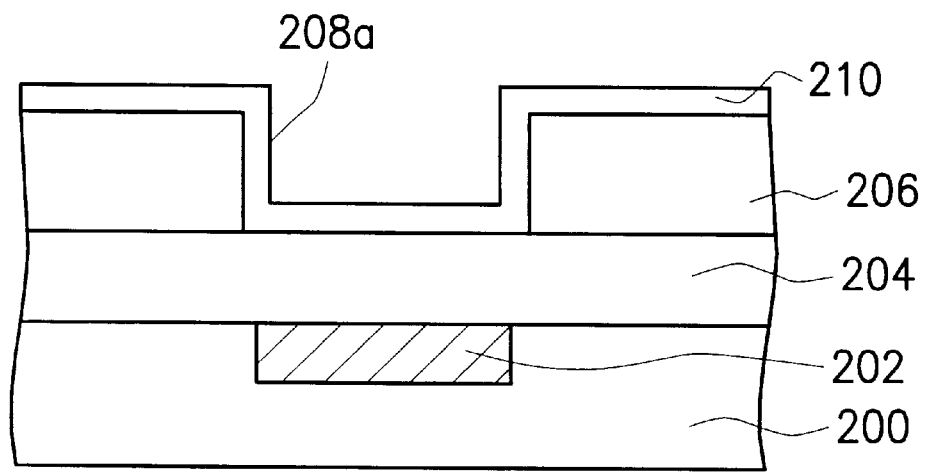

In FIG. 2B, a conformal insulating layer 210 is formed on the insulating layer 206 and in the first opening 208. A preferred material of the insulating layer 210 includes a compact oxide layer or silicon-oxy-nitride formed by, for example, high density plasma chemical vapor deposition (HDPCVD). The opening 208 is partially filled by the insulating layer 210 to result in an opening denoted as 208a. The insulating layer 210 formed by HDPCVD is more compact than the insulating layer 206, and as a consequence, the insulating layer 206 is protected from being damaged by oxygen plasma while removing the photo-resist layer subsequently.

Figure 2C:
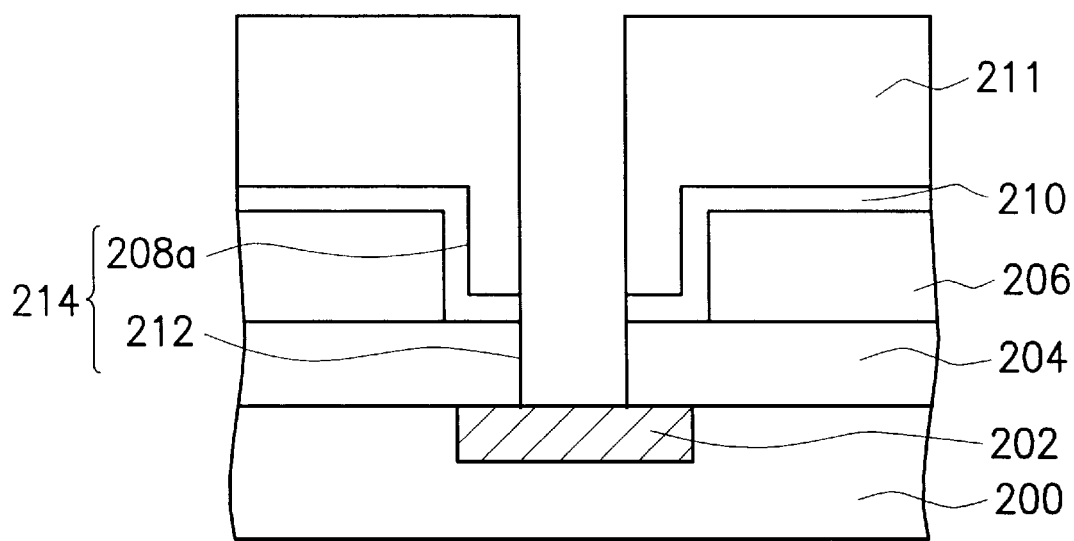

In FIG. 2C, the insulating layer 210 at the bottom of the opening 208a and the insulating layer 204 underlying the opening 208a are patterned to form a second opening 212. For example, using a photolithography and etching process, a photo-resist layer 211 is formed on the insulating layer 210. The photo-resist layer 211 has an opening positioned over the conductive layer 202 with a smaller dimension compared to the opening 208a. Using the photo-resist layer 211 as a mask, the insulating layer 210 at the bottom of the opening 208a and the insulating layer 204 underlying the opening 208a are removed. Therefore, a dual damascene opening 214 comprising the opening 208a and 212 is formed. The photoresist layer 211 is removed, for example, stripped by oxygen plasma. Since the insulating layer 210 having a compact structure can protect the insulating layer 206 which has a relatively incompact structure from being damaged by the oxygen plasma, the dual damascene opening 214 is not poisoned.

Figure 2D:
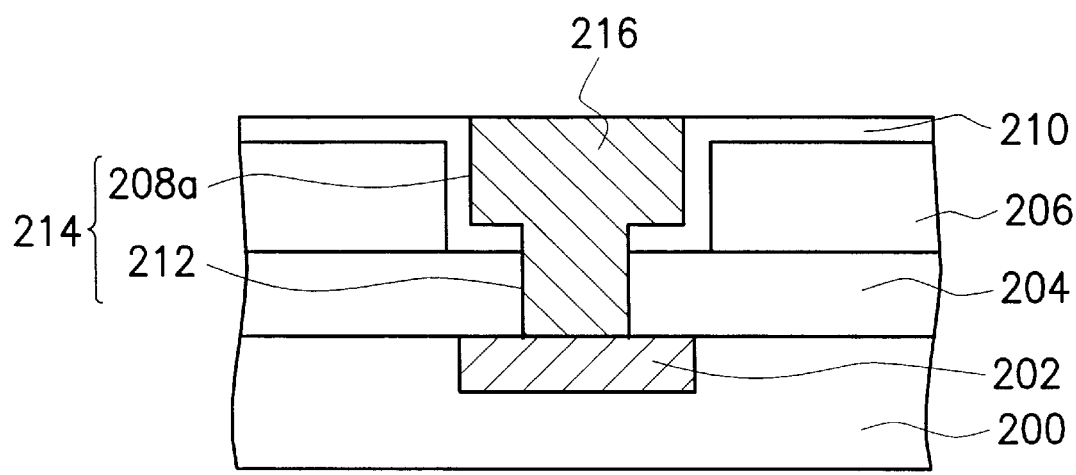

In FIG. 2D, a conductive layer 216 is formed to fill the dual damascene opening 214 to form a dual damascene structure. Copper has gradually become a popular material to be applied as the material of the conductive layer 216 due to its low resistivity and well developed techniques such as CVD, electroplating, electrode-less copper, and electrode-less.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a metal interconnect structure, comprising the steps of:
   providing a substrate with a first conductive layer therein;
   forming a first insulating layer and a second insulating layer sequentially on the substrate;
   patterning the second insulating layer to form a first opening exposing a part of the first insulating layer;
   forming a third insulating layer on the second insulating layer and in the first opening;
   providing a patterned photo-resist layer over the third insulating layer;
   patterning the third insulating layer at a bottom of the first opening and the underlying first insulating layer to form a second opening under the first opening, so that a part of the first conductive layer is exposed by the second opening;
   removing the patterned photo-resist layer; and
   filling the first and the second opening with a second conductive layer.

2. The method according to claim 1, wherein the first insulating layer includes an oxide layer formed by chemical vapor deposition.

3. The method according to claim 1, wherein the second insulating layer includes a dielectric layer with a low dielectric constant.

4. The method according to claim 3, wherein the dielectric layer with a low dielectric constant comprises a spin-on polymer layer.

5. The method according to claim 1, wherein the third insulating layer is made of a material compact enough to resist from being damaged while removing the photo-resist layer.

6. The method according to claim 5, wherein the third insulating layer is made of a material comprising a dielectric material which is substantially more compact than the second insulating layer.

7. The method according to claim 5, wherein the material of the third insulating layer comprises an oxide layer formed by high density plasma chemical vapor deposition.

8. The method according to claim 1, wherein the second conductive layer comprises a copper layer.

9. A method for fabricating a metal interconnect structure, comprising the steps of:
   providing a substrate comprising a first conductive layer;
   sequentially forming a first and a second insulating layers on the substrate;
   patterning the second insulating layer to form a first opening exposing a part of the first insulating layer;
   forming a third insulating layer on the second insulating layer and in the underlying first opening;
   patterning the third insulating layer on a bottom of the first opening and the first insulating layer to form a second opening exposing the first conductive layer; and
   filling the first and the second openings with a second conductive layer.

10. The method according to claim 9, wherein the first insulating layer is an oxide layer formed by chemical vapor deposition.

11. The method according to claim 9, wherein the second insulating layer is a dielectric layer with a low dielectric constant.

12. The method according to claim 11, wherein the dielectric layer with a low dielectric constant comprises a spin-on-polymer layer.

13. The method according to claim 9, wherein the third insulating layer comprises a dielectric layer which is sufficiently compact to protect the second insulating layer from being damaged by an oxygen plasma.

14. The method according to claim 13, wherein the third insulating layer comprises an oxide layer formed by high density plasma chemical vapor deposition.

15. The method according to claim 9, wherein the second conductive layer comprises a copper layer.

* * * * *